(12) United States Patent
Chen (10) Patent No.: US 11,127,848 B2
(45) Date of Patent: Sep. 21, 2021

(54) SEMICONDUCTOR STRUCTURE AND METHOD FOR FORMING THE SAME (71) Applicant: Vanguard International Semiconductor Corporation, Hsinchu (TW)

(72) Inventor: Chih-Yen Chen, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/699,409

(22) Filed: Nov. 29, 2019

(65) Prior Publication Data

US 2021/0167197 A1 Jun. 3, 2021

(51) Int. Cl.
*H01L 29/778* (2006.01)
*H01L 29/04* (2006.01)
*H01L 29/66* (2006.01)

(52) U.S. Cl.
CPC ........ *H01L 29/7786* (2013.01); *H01L 29/045* (2013.01); *H01L 29/66462* (2013.01)

(58) Field of Classification Search
CPC ............... H01L 29/7786; H01L 29/045; H01L 29/66462
USPC ......................................................... 257/194
See application file for complete search history.

(56) References Cited

U.S. PATENT DOCUMENTS 7,501,670 B2 * 3/2009 Murphy .............. H01L 27/0605
257/194
2019/0051538 A1 * 2/2019 Fujioka ................... C23C 16/27

* cited by examiner

*Primary Examiner* — Mark V Prenty
(74) *Attorney, Agent, or Firm* — Birch, Stewart, Kolasch & Birch LLP (57) ABSTRACT

A semiconductor structure includes a substrate structure having a plurality of first trenches extending in a first direction, a nucleation layer disposed on the substrate structure, a compound semiconductor layer disposed on the nucleation layer, a gate disposed on the compound semiconductor layer, and a source and a drain disposed on the compound semiconductor layer and at opposite sides of the gate.

21 Claims, 12 Drawing Sheets

SEMICONDUCTOR STRUCTURE AND METHOD FOR FORMING THE SAME

BACKGROUND

Technical Field

The disclosure relates to a semiconductor structure, and more particularly to semiconductor structure having compound semiconductor layers and methods for forming the same.

Description of the Related Art

Gallium nitride-based (GaN-based) semiconductor materials have many excellent characteristics, such as high thermal resistance, a wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) elements and high-frequency elements, such as high electron mobility transistors (HEMT) with heterogeneous interfacial structures.

However, in the operation of a thinned high electron mobility transistor (HEMT) device, if a high voltage is applied, it is easy to expand the depletion region and conduct electricity through the silicon substrate under the epitaxial layer, thereby causing substrate breakdown. It is difficult to achieve a good balance between the thinning of the high electron mobility transistor (HEMT) device and the breakdown voltage using existing technologies.

With the developments of GaN-based semiconductor materials, those semiconductor devices which use GaN-based semiconductor materials are applied in more critical working environments, such as those with higher frequencies or higher temperatures. Therefore, the conditions of the process of fabricating semiconductor devices with GaN-based semiconductor materials face various new challenges.

SUMMARY

In one embodiment of the present disclosure, a semiconductor structure is provided, wherein the semiconductor structure includes a substrate structure having a plurality of first trenches extending in a first direction, a nucleation layer disposed on the substrate structure, a compound semiconductor layer disposed on the nucleation layer, a gate disposed on the compound semiconductor layer, and a source and a drain disposed on the compound semiconductor layer and at opposite sides of the gate.

In one embodiment of the present disclosure, a method for forming a semiconductor structure is provided, wherein the method for forming a semiconductor structure includes: providing a substrate structure; performing an etching step to form a plurality of first trenches extending in a first direction in the substrate structure; conformally forming a nucleation layer on the substrate structure; forming a compound semiconductor layer on the nucleation layer; and forming a gate, a source, and a drain on the compound semiconductor layer, wherein the source and the drain are at opposite sides of the gate.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with steps performed in a particular order, these steps may be performed in another logical order. Additional features can be provided to the semiconductor structures in embodiments of the present disclosure. Some of the features described below can be replaced or eliminated for different embodiments.

The present disclosure provides embodiments of a semiconductor structure which includes a plurality of trenches formed in a substrate structure under a compound semiconductor layer, and the plurality of trenches extend in a specific direction. By the arrangement of the trenches, hiatuses can be formed when space charges which are in an active region of the semiconductor structure vertically expand into a conductive layer (e.g. a silicon layer) in the substrate structure, such that the substrate structure is laterally non-conductive to avoid substrate breakdown, thereby increasing the breakdown voltage and allowing the thinned semiconductor structure to be applied to high-voltage operation.

Figure 1:
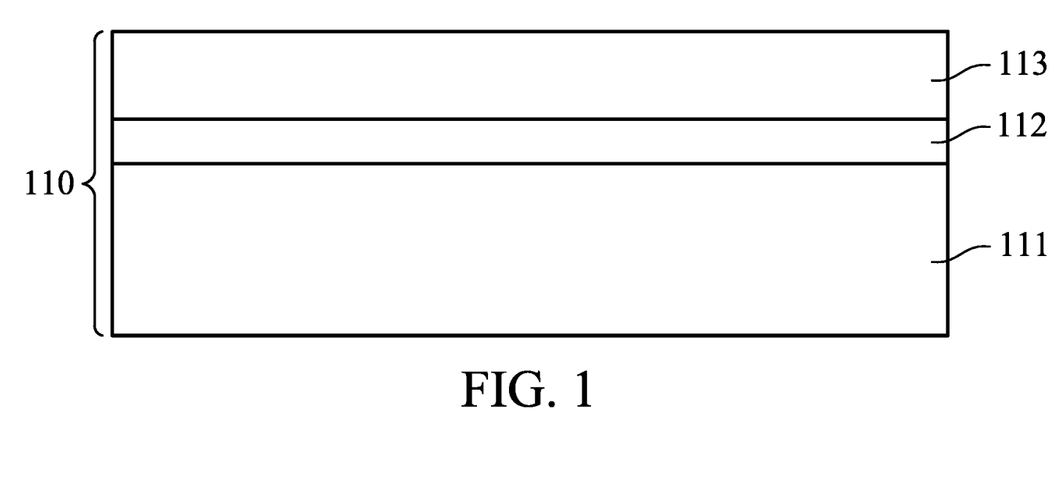
FIG. 1 is a cross-sectional view illustrating a step in the process of forming a semiconductor structure according to some embodiments of the present disclosure.
Figure 5:
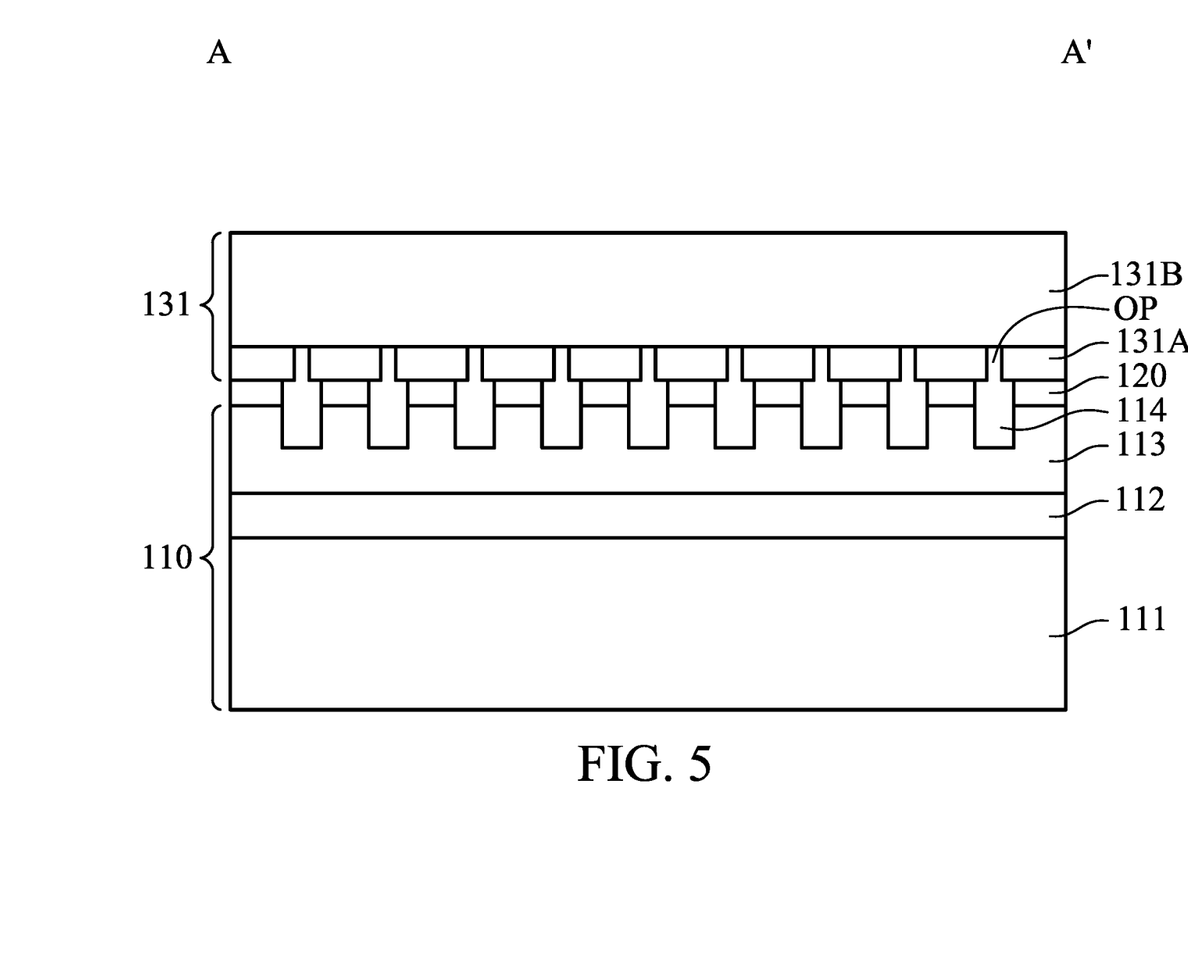
FIG. 5 is a cross-sectional view illustrating a step in the process of forming a semiconductor structure according to some embodiments of the present disclosure.
Figure 6:
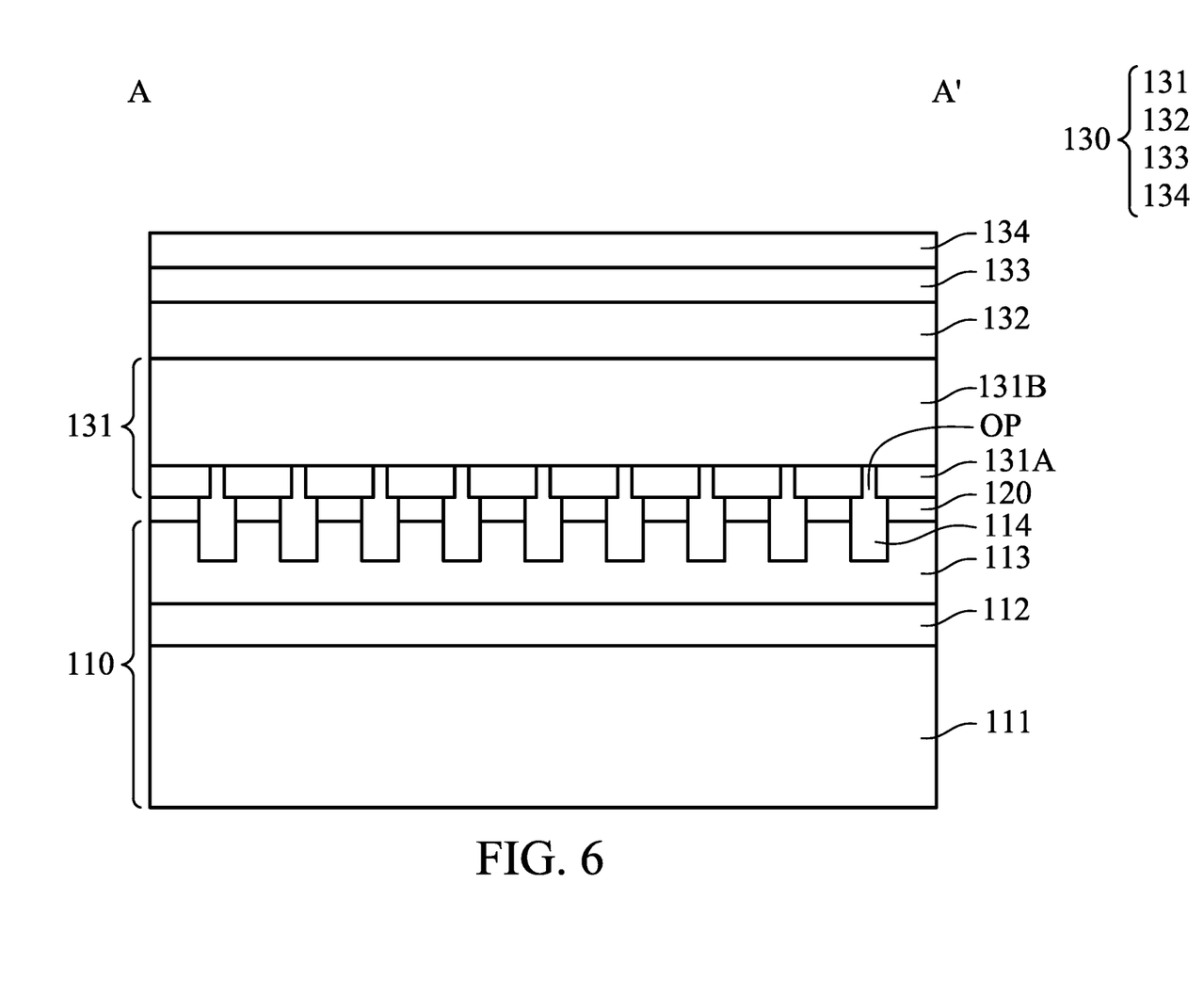
FIG. 6 is a cross-sectional view illustrating a step in the process of forming a semiconductor structure according to some embodiments of the present disclosure.
Figure 7:
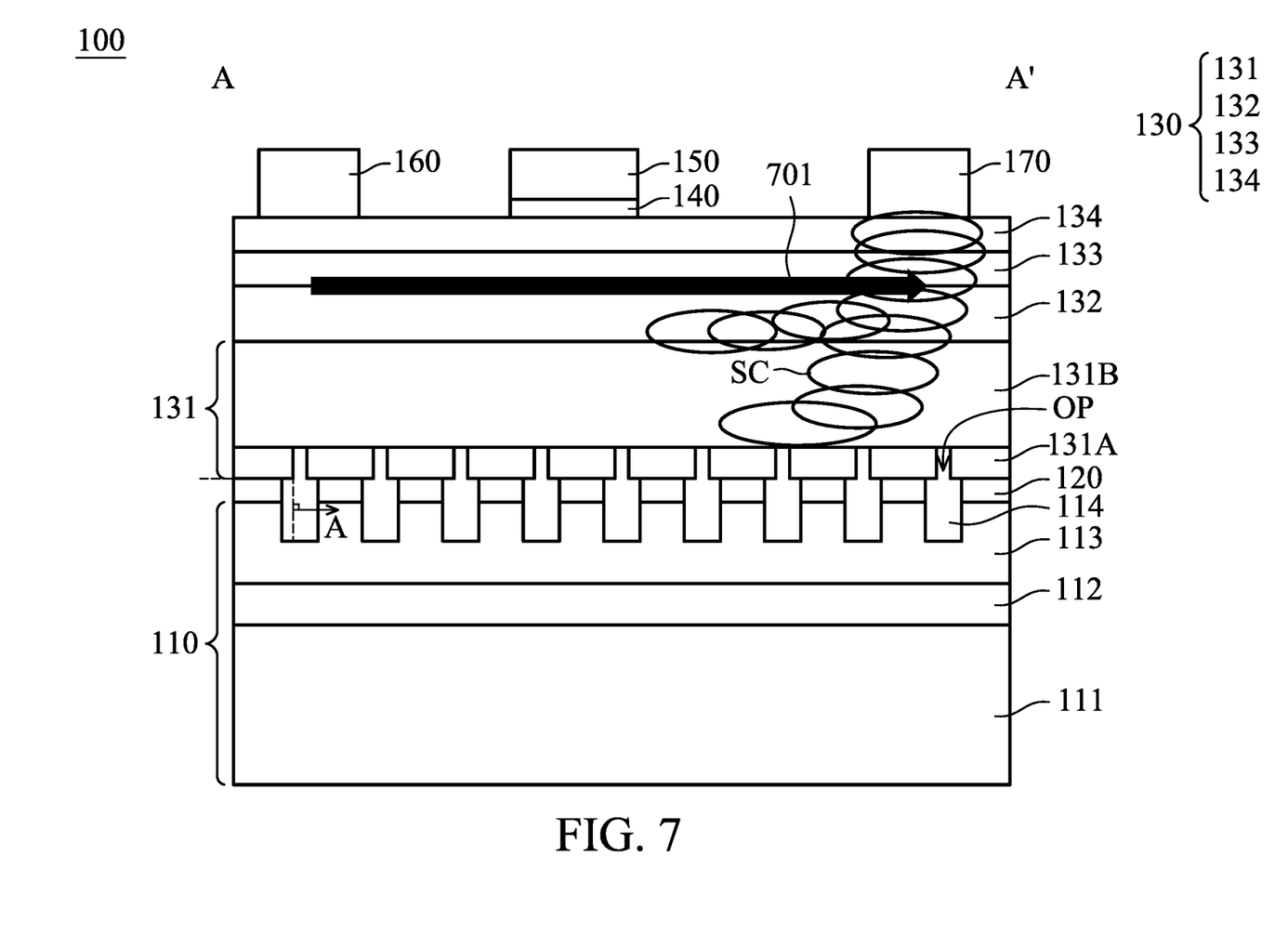
FIG. 7 is a cross-sectional view illustrating a step in the process of forming a semiconductor structure according to some embodiments of the present disclosure.

FIG. 1, FIG. 2, FIG. 3, FIG. 4, FIG. 5, FIG. 6, and FIG. 7 are cross-sectional views illustrating various steps in the process of forming a semiconductor structure 100 which is illustrated in FIG. 7 according to some embodiments of the present disclosure. Referring to FIG. 1, a substrate structure 110 is provided. In some embodiments, the substrate structure 110 is a silicon on insulator (SOI) substrate which includes a substrate 111, an insulating layer 112 formed on the substrate 111, and a silicon layer 113 formed on the insulating layer 112. In other embodiments, the substrate structure 110 also may be a bulk silicon substrate (not shown). In some embodiments, the substrate 111 also may be a QST™ substrate. As used herein, the QST™ substrate refers to the substrate produced by Qromis Technology, Inc.

In some embodiments, the substrate 111 may be a doped (such as doped with a p-type or an n-type dopant) or an undoped semiconductor substrate, such as a silicon substrate, a silicon germanium substrate, a gallium arsenide substrate, or the like. In other embodiments, the substrate 111 may be a ceramic substrate, such as an aluminum nitride (AlN) substrate, a silicon carbide (SiC) substrate, an aluminum oxide ($Al_2O_3$) (or so-called sapphire substrate), or the like. In some embodiments, the thickness of the substrate 111 may be in a range from about 300 micrometers (um) to about 1200 um, such as about 750 um.

The insulating layer 112 disposed on the substrate 111 is a layer having high thermal stability and high quality at a high temperature. In some embodiments, the insulating layer 112 is a high-quality silicon oxide insulating layer such as those produced from tetraethoxysilane (TEOS). In other embodiments, the insulating layer 112 is a dielectric layer, such as silicon oxide, silicon nitride, silicon oxynitride, silicon carbide, the like, or a combination thereof, formed by plasma-enhanced chemical vapor deposition (PECVD). In accordance with some embodiments of the present disclosure, the insulating layer 112 may provide a higher quality surface to facilitate subsequent formation of other layers of the semiconductor structure on its surface. In some embodiments, the thickness of the insulating layer 112 may be in a range from about 0.5 um to about 3 um, such as about 2 um.

In accordance with some embodiments of the present disclosure, a top surface of the silicon layer 113 which is disposed on the insulating layer 112 includes a (111) or (110) crystal plane orientation of silicon. Specifically, it is understood by those skilled in the art that crystalline semiconductor materials (e.g. silicon) include a plurality of atoms arranged in a three-dimensional structure, and such three-dimensional structures include a plurality of planes, each having a respective crystal orientation expressed by the Miller index. On the other hand, in the embodiments that the substrate structure 110 is a bulk silicon substrate, a top surface of the substrate structure 110 includes a (111) or (110) crystal plane orientation of silicon.

Subsequently, referring to FIG. 2, a patterning process is performed to form a plurality of trenches 114 in the substrate structure 110 (e.g. the silicon layer 113), wherein the patterning process may include a photolithography process and an etching process. In some embodiments, the depth of the trenches 114 may be controlled by adjusting the conditions of the etching process, such as etching duration, etching rate, concentration of the etch chemicals, and so on. The photolithography process may include photoresist coating (e.g. spin-coating), soft baking, exposure, post-exposure baking, photoresist developing, rinsing and drying (e.g. hard baking), other suitable processes, or a combination thereof. The etching process may include, for example, a wet etching process, a dry etching process (e.g. reactive ion etching (RIE)), other suitable etching processes, or a combination thereof. In some embodiments, a patterned photoresist (not shown) is formed on the substrate structure 110 by a photolithography process, and an etching step is performed to form the plurality of trenches 114 in the substrate structure 110 through a plurality of openings (not shown) of the patterned photoresist.

Figure 2:
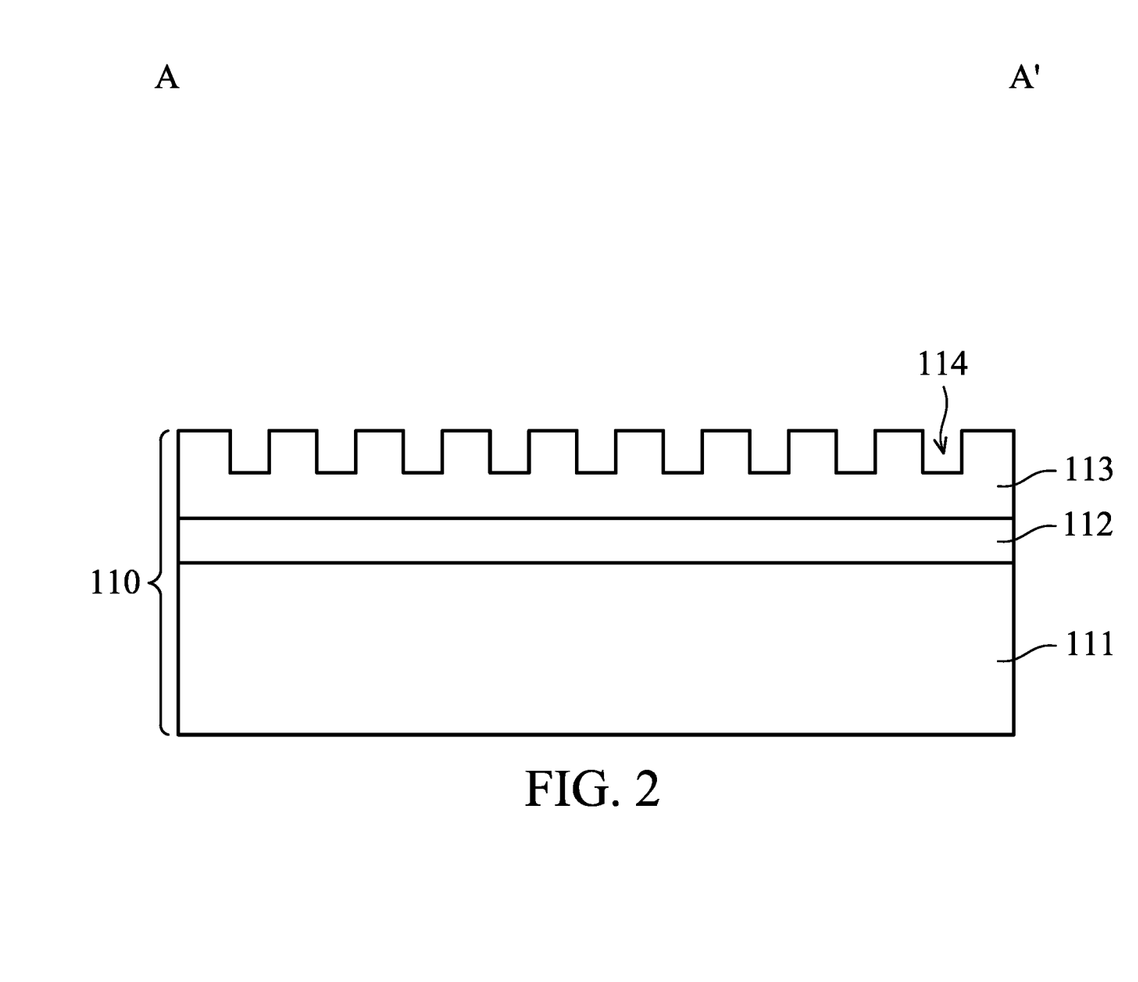
FIG. 2 is a cross-sectional view illustrating a step in the process of forming a semiconductor structure according to some embodiments of the present disclosure.
Figure 9A:
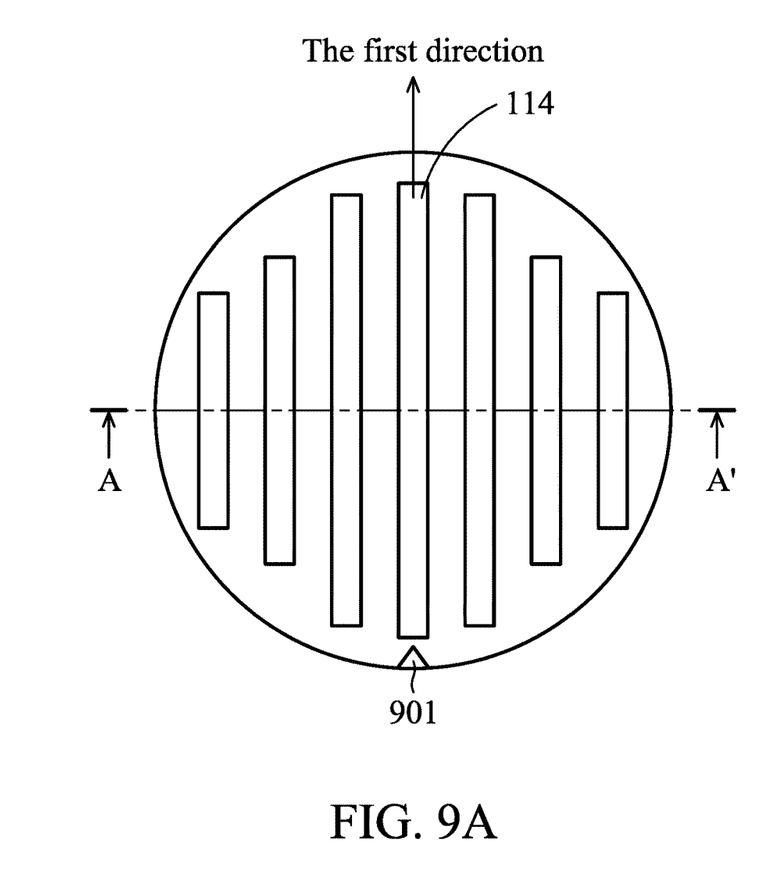
FIG. 9A is a top-view diagram illustrating an exemplary semiconductor structure according to some embodiments of the present disclosure.

Referring to FIG. 2 in conjunction with FIG. 9A, which is a top-view diagram of the exemplary semiconductor structure. In some embodiments, the semiconductor structure 100 illustrated in FIG. 2 is a cross-sectional view along the line segment A-A' illustrated in FIG. 9A. It should be noted that in order to succinctly describe the embodiments of the present disclosure and highlight the technical features thereof, not all the elements of the semiconductor structure 100 are illustrated in FIG. 9A. In some embodiments, as shown in FIG. 9A, the trenches 114 formed by the above-mentioned patterning process in the substrate structure 110 extend in the first direction. In other words, from a top view, the major axis of the trenches 114 is parallel to the first direction. In accordance with some embodiments of the present disclosure, the first direction may be a direction which a notch points to, wherein the notch is used in a manufacturing process to identify the crystal orientation of a wafer formed by a Czochralski process or a floating zone process. In accordance with other embodiments of the present disclosure, the first direction may be a <1-10> crystal orientation of the silicon layer 113, and the pointing direction of the notch 901 may be parallel to the <1-10> crystal orientation of the silicon layer 113. However, the extending direction of the trenches 114 provided in the embodiments of the present disclosure is not limited thereto.

By forming the plurality of trenches in a substrate structure under the compound semiconductor layer to extend in a specific direction (e.g. the pointing direction of the notch and/or the <1-10> crystal orientation of the silicon layer 113), hiatuses can be formed when space charges which are in an active region of the semiconductor structure vertically expand into a conductive layer (e.g. a silicon layer) in the substrate structure, such that the substrate structure is laterally non-conductive to avoid substrate breakdown.

Figure 9B:
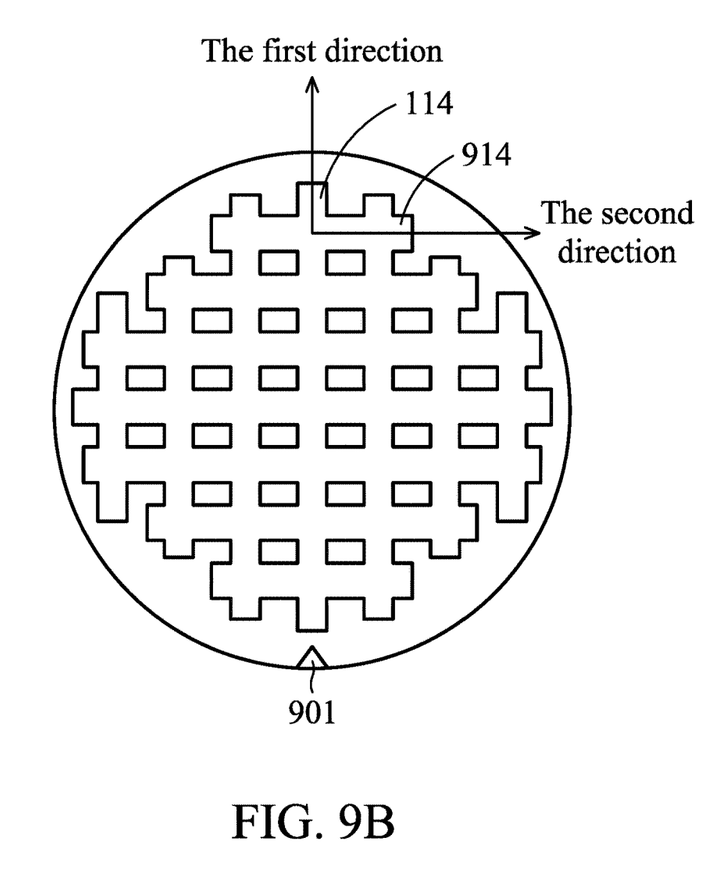
FIG. 9B is a top-view diagram illustrating an exemplary semiconductor structure according to other embodiments of the present disclosure.

Still referring to FIG. 2 and FIG. 9B. It should be noted that in order to succinctly describe the embodiments of the present disclosure and highlight the technical features thereof, not all the elements of the semiconductor structure 100 are illustrated in FIG. 9B. In some embodiments, the above-mentioned patterning process may form a plurality of first trenches 114 extending in the first direction and a plurality of second trenches 914 extending in the second direction which is different from the first direction simultaneously. As shown in FIG. 9B, the extending direction of the trenches 114 (i.e. the first direction) is perpendicular to the extending direction of the trenches 914 (i.e. the second direction). However, the embodiments of the present disclosure are not limited thereto. The angle between the first direction and the second direction may be adjusted according to the product design, for example, 30 degrees, 45 degrees, 80 degrees (not shown), or other angles.

By forming the first trenches 114 extending in the first direction and the second trenches 914 extending in the second direction simultaneously, the vertical expansion of the space charge in the active region of the semiconductor structure which extends to the conductive layer in the substrate structure can be blocked more effectively to avoid substrate breakdown and enhance the effect of releasing stress.

Subsequently, referring to FIG. 3, the nucleation layer 120 is conformally formed on the substrate structure 110 (e.g. the silicon layer 113). In some embodiments, the material of the nucleation layer 120 may be aluminum nitride (AlN). In other embodiments, the nucleation layer 120 may be formed by other semiconductor materials, such as doped silicon carbide (e.g. the silicon carbide may be doped with nitrogen or phosphorus to form a n-type semiconductor or doped with aluminum, boron, gallium, or beryllium to form a p-type semiconductor), Group III-V compound semiconductor materials, or the like. In some embodiments, the nucleation layer 120 may be formed on the substrate structure 110 by an epitaxial growth process, such as metal organic chemical vapor deposition (MOCVD), hydride vapor phase epitaxy (HVPE), molecular beam epitaxy (MBE), a combination thereof, or the like.

Figure 3:
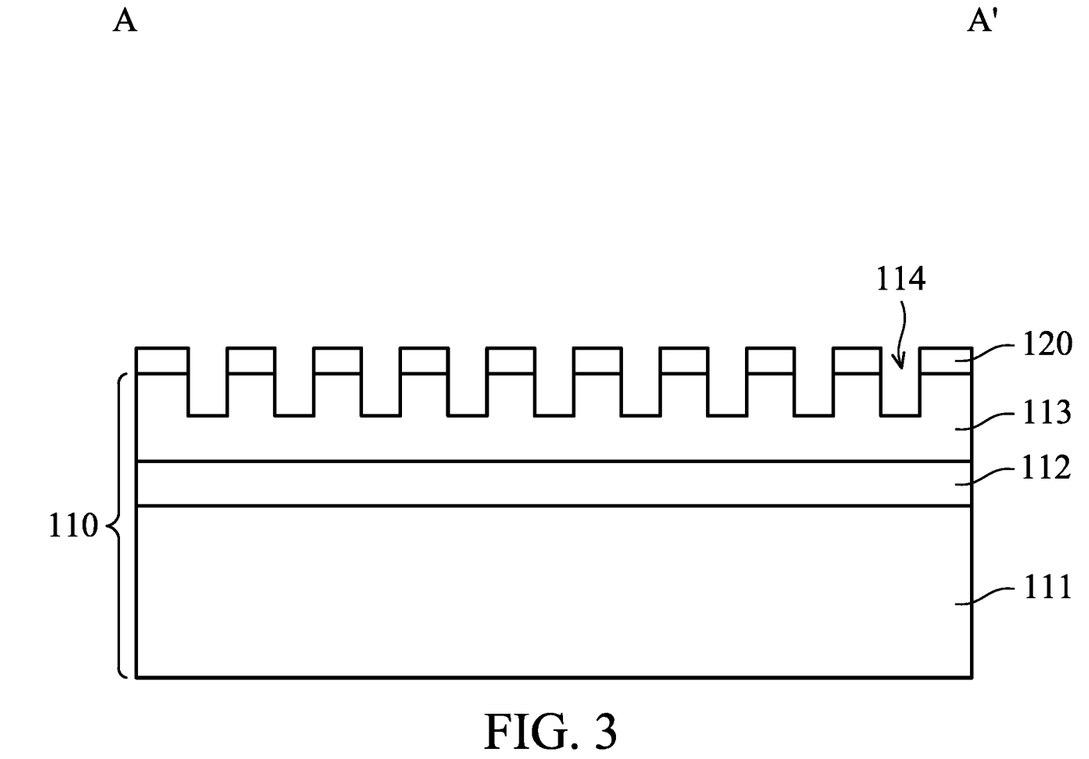
FIG. 3 is a cross-sectional view illustrating a step in the process of forming a semiconductor structure according to some embodiments of the present disclosure.

It should be noted that although only the nucleation layer 120 on the top surface of the substrate structure 110 is illustrated in FIG. 3, the nucleation layer 120 which is conformally formed on the substrate structure 110 may also be formed on the sidewall surface of the trenches 114 (not shown) simultaneously. The thickness of the nucleation layer 120 formed on the sidewall surface of the trenches 114 is insufficient to fill up the trenches such that the volume of the hiatuses inside the trenches may be maintained substantially.

Figure 4:
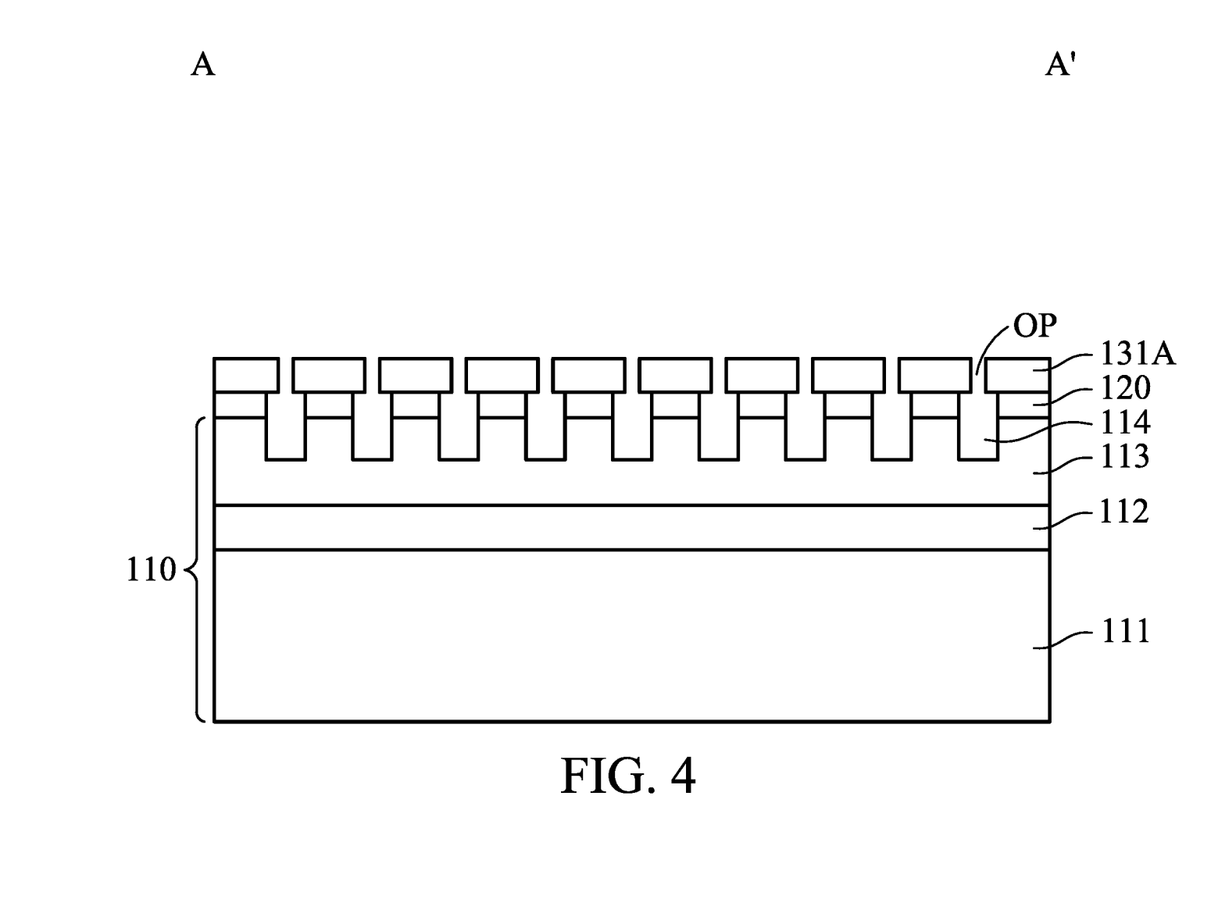
FIG. 4 is a cross-sectional view illustrating a step in the process of forming a semiconductor structure according to some embodiments of the present disclosure.

FIGS. 4-6 are cross-sectional views illustrating various steps in the process of forming the compound semiconductor layer 130 on the nucleation layer 120. In some embodiments, the compound semiconductor layer 130 may include a buffer layer 131 formed on the nucleation layer 120, a channel layer 132 formed on the buffer layer 131, a barrier layer 133 formed on the channel layer 132, and a capping layer 134 formed on the barrier layer 133.

The buffer layer 131 may be helpful to mitigate a strain of the channel layer 132 which is subsequently formed over the buffer layer 131, and to prevent defects formed in the overlying channel layer 132. The strain is caused by a mismatch between the channel layer 132 and the substrate structure 110. In some embodiments, the material of the buffer layer 131 may be AlN, GaN, $Al_xGa_{1-x}N$ (wherein 0<x<1), a combination thereof, or the like. The buffer layer 131 may be formed by an epitaxial growth process, such as metal organic chemical vapor deposition (MOCVD), hydride vapor phase epitaxy (HVPE), molecular beam epitaxy (MBE), a combination thereof, or the like. According to some embodiments of the present disclosure, in the cross-sectional diagram, the buffer layer 131 formed by the epitaxial growth process includes a discrete layer (e.g. the first buffer layer 131A) and a continuous layer (e.g. the second buffer layer 131B) sequentially stacked on the nucleation layer 120.

Referring to FIGS. 4 and 5, the first buffer layer 131A and the second buffer layer 131B growing on the nucleation layer 120 is illustrated in the cross-sectional diagram. In FIGS. 4 and 5, the first buffer layer 131A has a plurality of openings OP above the plurality of trenches 114 and forms into a discrete layer, wherein the width of the openings OP is less than the width of the trenches 114, so as to facilitate the subsequent formation of the second buffer layer 131B on the first buffer layer 131A to form a flat and continuous layer.

It should be noted that, in the above-mentioned embodiment wherein the extending direction of the trenches 114 is parallel to the <1-10> crystal orientation of the silicon layer 113, due to the lattice structure characteristics of the buffer layer 131 and the substrate structure 110, the buffer layer 131 cannot be epitaxially grown on the sidewall of the trenches 114 such that the volume of the hiatuses inside the trenches 114 may be maintained substantially. However, the buffer layer 131 can be laterally and upwardly grown on the top surface of the nucleation layer 120, thereby forming the discrete first buffer layer 131A which gradually conjoins but still has a plurality of openings OP, and forming the flat and continuous second buffer layer 131B which is completely conjoined during growth. In other embodiments, the buffer layer 131 may be grown laterally rapidly, so that the discrete first buffer layer 131A does not exist. In other words, there are no openings OP in the buffer layer 131 (e.g. the buffer layer 131 illustrated in the subsequent FIGS. 8A, 8B, 8C, and 8D).

In other embodiments, the step of epitaxially growing the buffer layer 131 may be performed after depositing dielectric materials in the trenches 114 and/or the trenches 914 and the subsequent planarization step to prevent the material of the buffer layer 131 from epitaxially growing in the trenches 114 and/or the trenches 914. In some embodiments, the dielectric materials may include, for example, silicon oxide, silicon nitride, silicon oxynitride, tetraethoxysilane (TEOS), phosphosilicate glass (PSG), borophosphosilicate glass (BPSG), low-k dielectric materials, and/or other suitable dielectric materials. The low-k dielectric materials may include fluorinated silica glass (FSG), hydrogen silsesquioxane (HSQ), carbon-doped silicon oxide, amorphous fluorinated carbon, parylene, bis-benzocyclobutenes (BCB), or polyimide, but they are not limited thereto. For example, a deposition process, such as spin coating, chemical vapor deposition (CVD), physical vapor deposition (PVD), atomic layer deposition (ALD), high density plasma CVD (HDPCVD), other suitable methods, or a combination thereof, may be used to deposit the dielectric materials in the trenches 114 and/or the trenches 914.

In accordance with the above-mentioned embodiments of the present disclosure, thanks to the design in which the trenches extend in a direction parallel to the <1-10> crystal orientation of the silicon layer 113, or in which the trenches are filled with dielectric materials when the trenches extend in a direction that is not parallel to the <1-10> crystal orientation of the silicon layer 113, the volume of the hiatuses inside the trenches may substantially be maintained during the subsequent formation of the compound semiconductor layer 130. In this way, the vertical expansion of the space charge in the active region of the semiconductor structure 100 can be blocked effectively, and the substrate breakdown which is caused by the extension of the space charge to the conductive layer (e.g. the silicon layer 113) in the substrate structure 110 can be avoided.

Subsequently, referring to FIG. 6, in some embodiments, the channel layer 132 may be a GaN layer, and the barrier layer 133 formed on the channel layer 132 may be an AlGaN layer, wherein the GaN layer and the AlGaN layer may be doped, such as with an n-type or a p-type dopant, or they may have no dopant therein. The capping layer 134 formed on the barrier layer 133 may be Group III-V compound semiconductor materials for passivating the surface of the material to significantly suppress the current collapse effect and reduce the surface leakage current. The channel layer 132, the barrier layer 133, and the capping layer 134 may be formed by an epitaxial growth processes, such as MOCVD, HVPE, MBE, a combination thereof, or the like. In some embodiments, the thickness of the channel layer 132 thus formed may be in a range from about 10 nanometers (nm) to about 1 um, such as about 0.4 um. The thickness of the barrier layer 133 thus formed may be in a range from about 5 nm to about 30 nm, such as about 25 nm. The thickness of the capping layer 134 thus formed may be in a range from about 0.5 nm to about 10 nm, such as about 2 nm.

According to some embodiments of the present disclosure, two-dimensional electron gas (2DEG) is formed at a heterogeneous interface between the channel layer 132 and the barrier layer 133. The semiconductor structure 100 as shown in FIG. 7 is a high electron mobility transistor (HEMT) which utilizes 2DEG as conductive carriers.

Subsequently, referring to FIG. 7, the gate 150 is formed on the compound semiconductor layer 130 (e.g. the capping layer 134), and the source 160 and the drain 170 are formed at opposite sides of the gate 150 to form the semiconductor structure 100. According to some embodiments of the present disclosure, the semiconductor structure 100 is a high electron mobility transistor (HEMT). In some embodiments, an optional doped compound semiconductor layer 140 may be disposed between the gate 150 and the capping layer 134. The details will be further described later.

In some embodiments, the materials of the gate 150, the source 160, and the drain 170 may be conductive materials, such as metal, metal nitride, or semiconductor materials. In some embodiments, the metal materials may be Au, Ni, Pt, Pd, Ir, Ti, Cr, W, Al, Cu, the like, a combination thereof, or multilayers thereof. The semiconductor materials may be polycrystalline silicon or polycrystalline germanium. The conductive material may be formed on the capping layer 134 by chemical vapor deposition (CVD), sputtering, resistive thermal evaporation process, electron beam evaporation process, or other suitable deposition processes, and a patterning process is performed on the conductive material to form the gate 150, the source 160, and the drain 170.

According to some embodiments of the present disclosure, before the formation of the gate 150, the doped compound semiconductor layer 140 may be formed on the capping layer 134, and the gate 150 is subsequently formed on the doped compound semiconductor layer 140. The generation of 2DEG under the gate 150 can be inhibited by the doped compound semiconductor layer 140 disposed between the gate 150 and the capping layer 134 so as to attain a normally-off status of the semiconductor structure 100. In some embodiments, the material of the doped compound semiconductor layer 140 may be GaN which is doped with a p-type dopant or an n-type dopant. The steps of forming the doped compound semiconductor layer 140 may include depositing a doped compound semiconductor layer (not shown) on the capping layer 134 by using an epitaxial growth process, and performing a patterning process on the doped compound semiconductor layer to form the doped compound semiconductor layer 140 corresponding to the predetermined position where the gate 150 is to be formed.

It should be noted that the type of gate structure of the semiconductor structure 100 provided in the present disclosure is not limited. For example, the types of gate structure, such as a metal-insulator-semiconductor gate (MIS-gate), a recess gate, a fluorine gate formed by doping the barrier layer 133 with fluoride ions under the gate 150, and so on, can be applied to the semiconductor structure 100 provided in the embodiment of the present disclosure according to different product designs.

Still referring to FIG. 7, according to some embodiments of the present disclosure, the vertical sidewall of the trenches 114 has a normal direction A, wherein the normal direction A is parallel to the carrier flow direction of the carrier channel 701 at the heterogeneous interface between the channel layer 132 and the barrier layer 133. On the other hand, in the embodiment wherein the extending direction of the trenches 114 (i.e. the first direction) is parallel to the <1-10> crystal orientation of the silicon layer 113, the normal direction of the vertical sidewall of the trenches 114 is parallel to the <001> crystal orientation of the silicon layer 113. In the embodiment, the carrier flow direction of the carrier channel 701 is also parallel to the <1-10> crystal orientation of the silicon layer 113.

In summary, by the arrangement of the relative positions of the trenches 114 and the carrier channel 701, the trenches 114 formed in the substrate structure 110 can effectively block the vertical expansion of the space charge SC in the active region of the semiconductor structure 100, and the substrate breakdown which is caused by the extension of the space charge SC to the substrate structure 110 can be avoided, thereby increasing the breakdown voltage and allowing the thinned semiconductor structure to be applied to high-voltage operation.

FIGS. 8A, 8B, 8C, and 8D are cross-sectional diagrams illustrating exemplary semiconductor structures 100A, 100B, 100C, and 100D according to other embodiments of the present disclosure. As shown in FIGS. 8A, 8B, 8C, and 8D, the structures of the semiconductor structures 100A, 100B, 100C, and 100D are substantially similar to the semiconductor structure 100 illustrated in FIG. 7, wherein the differences therebetween are that the trenches 114A, 114B, 114C, and 114D with different depths are respectively formed in the substrate structure 110 by adjusting the above-mentioned conditions of etching step (e.g. etching duration, etching rate, concentration of the etch chemicals, and so on). It should be noted that in order to succinctly describe the embodiments of the present disclosure and highlight the technical features thereof, only a single layer of the buffer layer 131 is illustrated in FIGS. 8A, 8B, 8C, and 8D. The semiconductor structures 100A, 100B, 100C, and 100D respectively illustrated in FIGS. 8A, 8B, 8C, and 8D may optionally include a dielectric material 801 filled into the trenches.

Figure 8A:
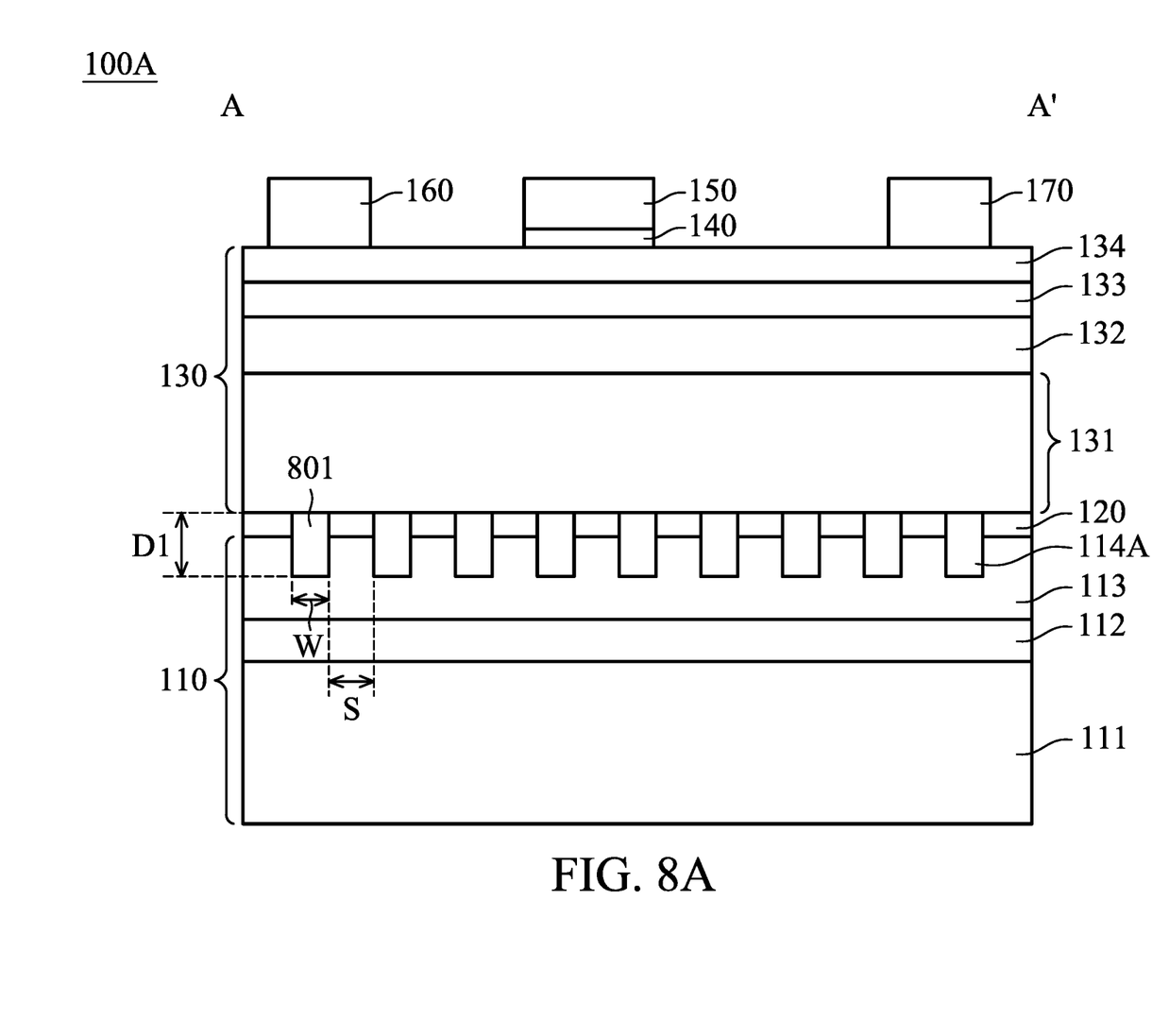
FIG. 8A is a cross-sectional diagram illustrating an exemplary semiconductor structure according to some embodiments of the present disclosure.

Referring to FIG. 8A, the trenches 114A in the substrate structure 110 of the semiconductor structure 100A partially penetrate the silicon layer 113 of the substrate structure 110. In some embodiments, the trenches 114A have the depth D1, wherein the depth D1 is in a range from about 0.05 um to about 0.2 um, such as about 0.1 um. The trenches 114A have the width W, wherein the width W is in a range from about 0.2 um to about 6 um, such as about 2 um. A space S between the trenches 114A is in a range from about 0.5 um to about 10 um, such as about 5 um.

Figure 8B:
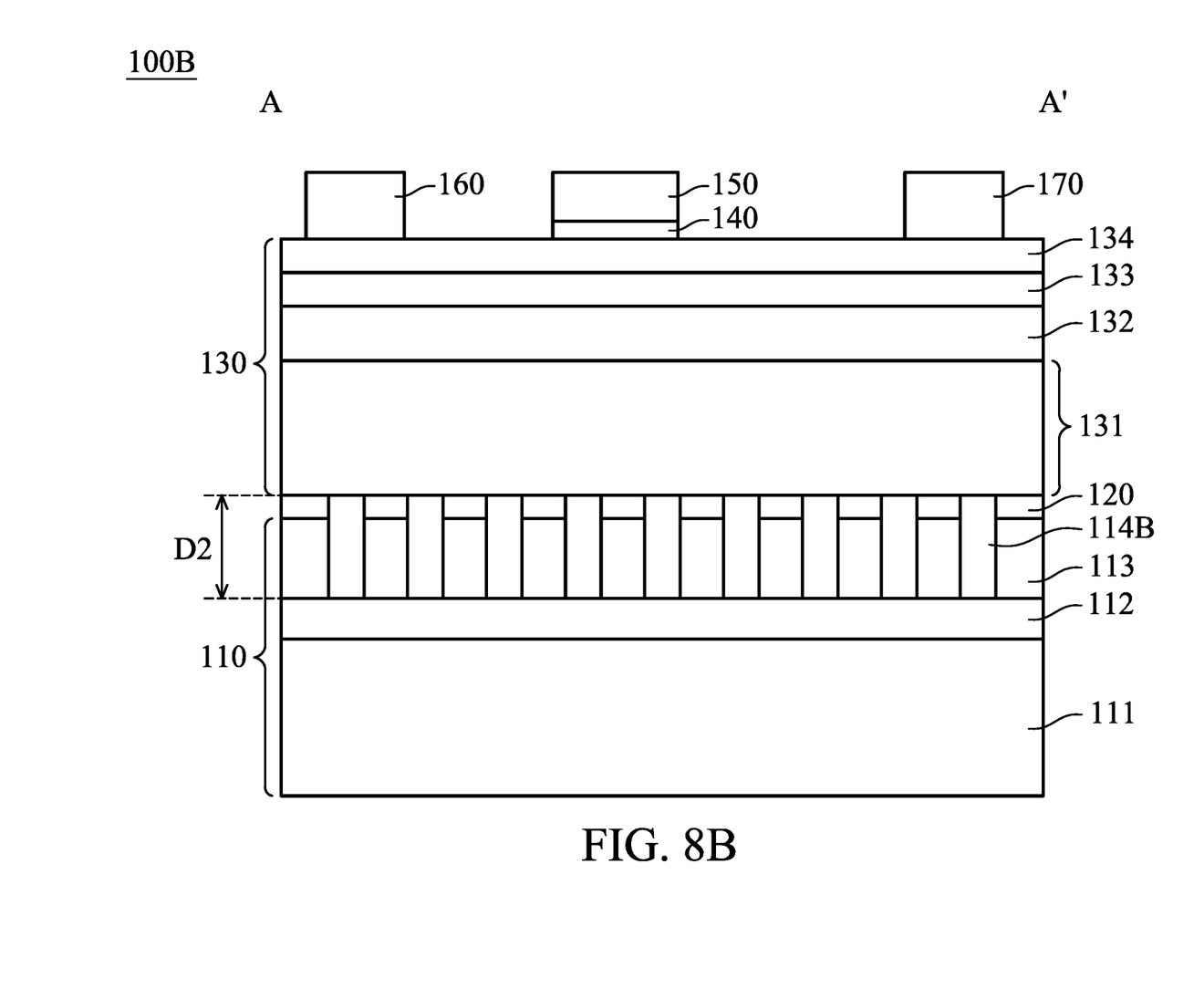
FIG. 8B is a cross-sectional diagram illustrating an exemplary semiconductor structure according to other embodiments of the present disclosure.
Figure 8C:
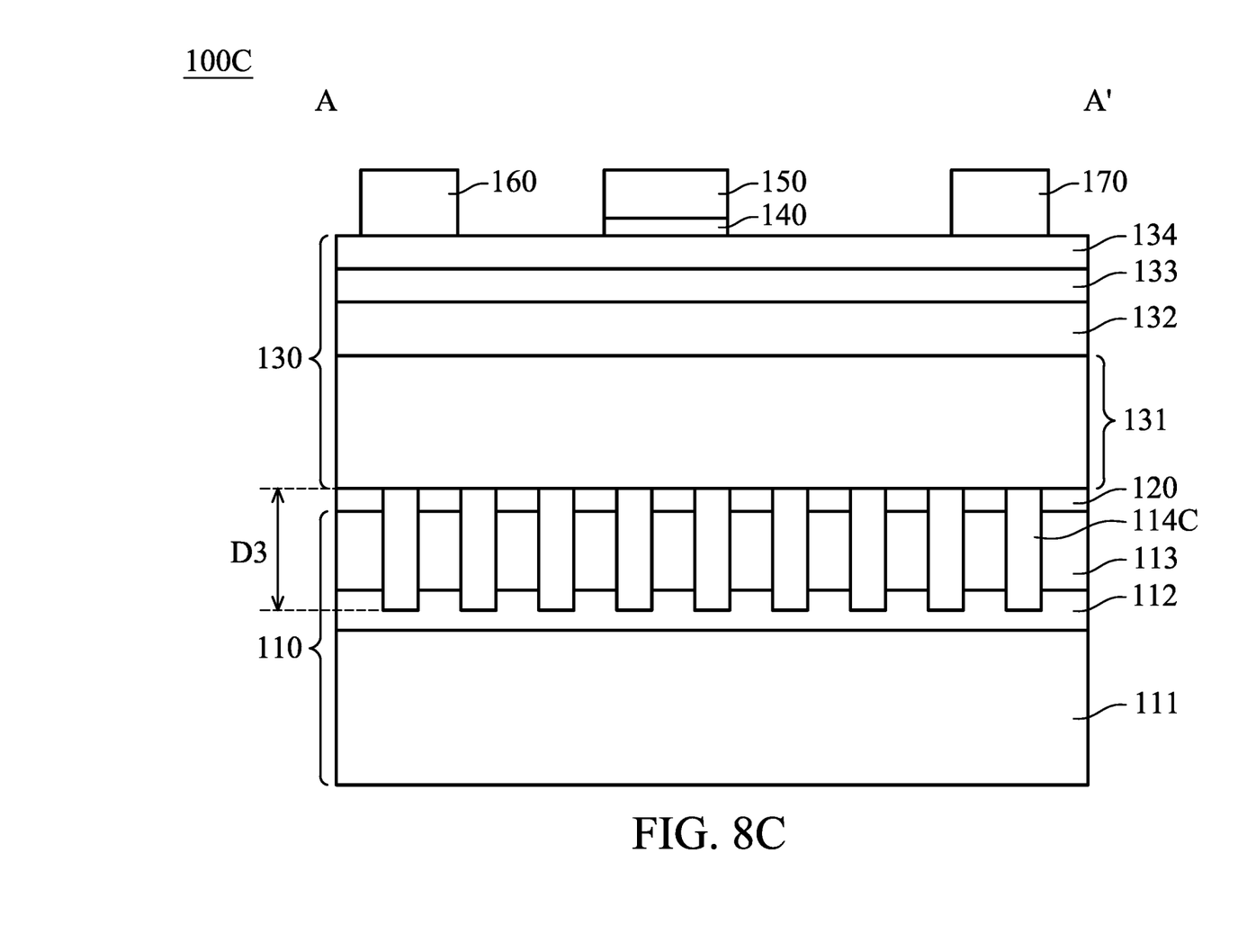
FIG. 8C is a cross-sectional diagram illustrating an exemplary semiconductor structure according to other embodiments of the present disclosure.
Figure 8D:
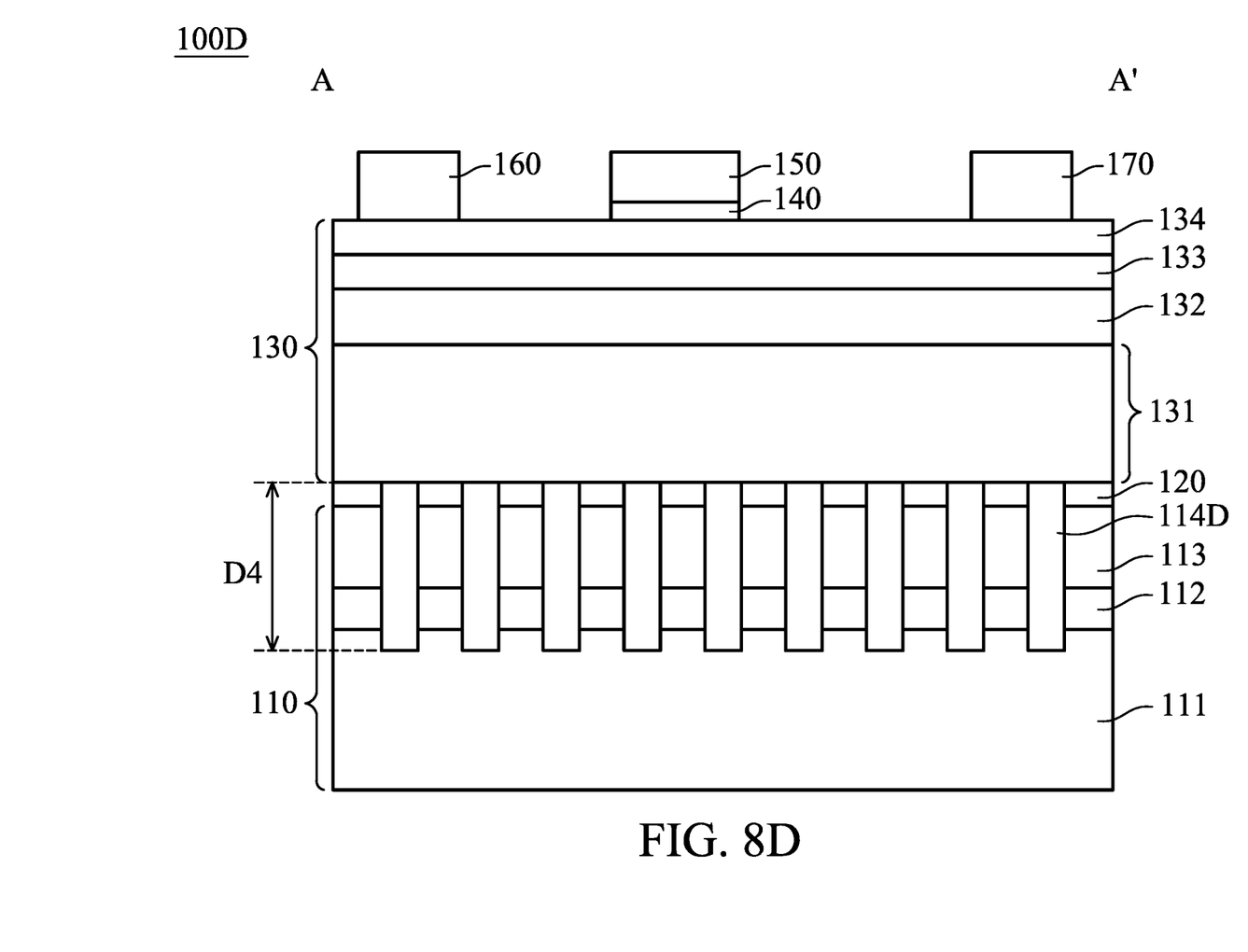
FIG. 8D is a cross-sectional diagram illustrating an exemplary semiconductor structure according to other embodiments of the present disclosure.

Referring to FIG. 8B, the trenches 114B in the substrate structure 110 of the semiconductor structure 100B completely penetrate the silicon layer 113 such that the bottom surface of the trenches 114B is substantially coplanar with the bottom surface of the silicon layer 113 of the substrate structure 110. In some embodiments, the trenches 114B have the depth D2, wherein the depth D2 is in a range from about 0.05 um to about 0.4 um, such as about 0.2 um. Referring to FIG. 8C, the trenches 114C in the substrate structure 110 of the semiconductor structure 100C penetrate through the silicon layer 113 and partially penetrate the insulating layer 112 under silicon layer 113. In other words, the bottom surface of the trenches 114C is lower than the bottom surface of the silicon layer 113 of the substrate structure 110 and located in the insulating layer 112 under silicon layer 113. In some embodiments, the trenches 114C have the depth D3, wherein the depth D3 is in a range from about 0.05 um to about 2 um, such as about 1 um. Referring to FIG. 8D, the trenches 114D in the substrate structure 110 of the semiconductor structure 100D penetrate through the silicon layer 113 and the insulating layer 112, and partially penetrate the substrate 111 under the insulating layer 112. In other words, the bottom surface of the trenches 114D is lower than the bottom surface of the insulating layer 112 of the substrate structure 110 and located in the substrate 111 under insulating layer 112. In some embodiments, the trenches 114D have the depth D4, wherein the depth D4 is in a range from about 0.05 um to about 8 um, such as about 4 um. It should be noted that the depths, the widths, and the spaces between the trenches provided in the embodiments of the present disclosure are merely exemplary, and the present disclosure is not limited thereto.

According to some embodiments of the present disclosure, by adjusting the conditions of the above-mentioned etching step to form the trenches with different depths (e.g. an aspect ratio in the range from about 0.01 to about 50, such as 10), the effect to release stress may be better with the trenches having a deeper depth in the substrate structure 110, but it is also likely to increase the cost of the etching process. The depth, width, and space of the plurality of trenches extending in a specific direction in the substrate structure formed under the compound semiconductor layer provided in the embodiments of the present disclosure can be adjusted according to product designs to achieve a balance between the effect of releasing stress and the process cost.

In summary, the arrangement of the relative positions of the carrier channel 701 and the plurality of trenches extending in a specific direction (e.g. the <1-10> crystal orientation of the silicon layer) in the substrate structure under the compound semiconductor layer effectively blocks the vertical expansion of the space charge in the active region of the semiconductor structure, and a substrate breakdown caused by the extension of the space charge to the conductive layer (e.g. the silicon layer) of the substrate structure can be avoided, thereby increasing the breakdown voltage and allowing the thinned semiconductor structure to be applied to high-voltage operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate structure, wherein the substrate structure comprises a plurality of first trenches extending in a first direction, wherein the substrate structure further comprises:
        a substrate;
        an insulating layer disposed on the substrate; and
        a silicon layer disposed on the insulating layer, wherein the plurality of first trenches are disposed in the silicon layer;
    a nucleation layer disposed on the substrate structure;
    a compound semiconductor layer disposed on the nucleation layer;
    a gate disposed on the compound semiconductor layer; and
    a source and a drain disposed on the compound semiconductor layer and at opposite sides of the gate.

2. The semiconductor structure as claimed in claim 1, wherein the substrate is a silicon substrate.

3. The semiconductor structure as claimed in claim 1, wherein the substrate is an aluminum nitride substrate, a silicon carbide substrate, or an aluminum oxide substrate.

4. The semiconductor structure as claimed in claim 1, wherein a top surface of the silicon layer comprises a (111) crystal plane orientation of silicon or a (110) crystal plane orientation of silicon.

5. The semiconductor structure as claimed in claim 1, further comprising a dielectric material filled into the plurality of first trenches.

6. The semiconductor structure as claimed in claim 1, wherein the semiconductor structure is a high electron mobility transistor, and the compound semiconductor layer comprises:
    a first buffer layer disposed on the nucleation layer, wherein in a cross-sectional view, the first buffer layer is a discrete layer;
    a second buffer layer disposed on the first buffer layer, wherein in a cross-sectional view, the second buffer layer is a continuous layer;
    a channel layer disposed on the second buffer layer; and
    a barrier layer disposed on the channel layer, wherein a plurality of carrier channels are between the channel layer and the barrier layer.

7. The semiconductor structure as claimed in claim 6, further comprising a doped compound semiconductor layer disposed between the gate and the barrier layer.

8. The semiconductor structure as claimed in claim 1, wherein the substrate structure further comprises a plurality of second trenches extending in a second direction which is different from the first direction.

9. The semiconductor structure as claimed in claim 1, wherein the first direction is a <1-10> crystal orientation of the silicon layer.

10. The semiconductor structure as claimed in claim 6, wherein a normal direction of a sidewall of the plurality of first trenches is parallel to a <001> crystal orientation of the silicon layer.

11. The semiconductor structure as claimed in claim 10, wherein the plurality of carrier channels are parallel to the normal direction of the sidewall of the plurality of first trenches.

12. A method for forming the semiconductor structure as set forth in claim 1, comprising:
   providing a substrate structure, wherein the substrate structure comprises:
      a substrate;
      an insulating layer formed on the substrate; and
      a silicon layer formed on the insulating layer;
   performing an etching step to form a plurality of first trenches extending in a first direction in the substrate structure, wherein the plurality of first trenches formed by the etching step are formed in the silicon layer;
   conformally forming a nucleation layer on the substrate structure;
   forming a compound semiconductor layer on the nucleation layer; and
   forming a gate, a source, and a drain on the compound semiconductor layer, wherein the source and the drain are at opposite sides of the gate.

13. The method as claimed in claim 12, wherein the plurality of first trenches formed by the etching step penetrate through the silicon layer.

14. The method as claimed in claim 12, wherein a top surface of the silicon layer comprises a (111) crystal plane orientation of silicon or a (110) crystal plane orientation of silicon.

15. The method as claimed in claim 12, wherein the etching step further comprises forming a plurality of second trenches extending in a second direction which is different form the first direction in the substrate structure.

16. The method as claimed in claim 15, further comprising:
   depositing a dielectric material in at least one of the plurality of first trenches and the plurality of second trenches.

17. The method as claimed in claim 16, further comprising:
   performing a planarization step after depositing the dielectric material in at least one of the plurality of first trenches and the plurality of second trenches.

18. The method as claimed in claim 12, wherein the semiconductor structure is a high electron mobility transistor, and the formation of the compound semiconductor layer on the nucleation layer comprises:
   forming a first buffer layer on the nucleation layer, wherein in a cross-sectional view, the first buffer layer is a discrete layer;
   forming a second buffer layer on the first buffer layer, wherein in a cross-sectional view, the second buffer layer is a continuous layer;
   forming a channel layer on the second buffer layer; and
   forming a barrier layer on the channel layer, wherein a plurality of carrier channels are between the channel layer and the barrier layer.

19. The method as claimed in claim 18, further comprising forming a doped compound semiconductor layer between the gate and the barrier layer.

20. The method as claimed in claim 18, wherein the first direction is a <1-10> crystal orientation of the silicon layer.

21. The method as claimed in claim 20, wherein a normal direction of a sidewall of the plurality of first trenches is parallel to a <001> crystal orientation of the silicon layer, and a carrier flow direction of the plurality of carrier channels is parallel to the normal direction of the sidewall of the plurality of first trenches.

* * * * *